(12) United States Patent
Jeong

(10) Patent No.: US 10,224,346 B2
(45) Date of Patent: Mar. 5, 2019

(54) DISPLAY APPARATUS WITH CURVED CONTACTS

(71) Applicant: SAMSUNG DISPLAY CO., LTD., Yongin-si, Gyeonggi-Do (KR)

(72) Inventor: Heesoon Jeong, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/432,194

(22) Filed: Feb. 14, 2017

(65) Prior Publication Data

US 2017/0243890 A1 Aug. 24, 2017

(30) Foreign Application Priority Data

Feb. 19, 2016 (KR) .................. 10-2016-0019685

(51) Int. Cl.
*H01L 29/40* (2006.01)
*H01L 23/52* (2006.01)
(Continued)

(52) U.S. Cl.
CPC ............ *H01L 27/124* (2013.01); *H01L 24/05* (2013.01); *H01L 24/06* (2013.01); *H01L 24/08* (2013.01); *H01L 24/09* (2013.01); *H05K 1/117* (2013.01); *H05K 1/183* (2013.01); *H01L 2224/05026* (2013.01); *H01L 2224/0603* (2013.01); *H01L 2224/06051* (2013.01); *H01L 2224/06102* (2013.01); *H01L 2224/06135* (2013.01); *H01L 2224/06177* (2013.01); *H01L 2224/06181* (2013.01); *H01L 2224/08238* (2013.01);
(Continued)

(58) Field of Classification Search
CPC ....... H01L 27/124; H01L 24/08; H01L 24/09; H01L 24/06; H01L 24/05; H01L 2224/06051; H01L 2224/0603; H01L 2224/06135; H01L 2224/06177; H01L 2224/06181; H01L 2224/08238; H01L 2224/05026; H01L 2224/06102; H05K 1/183; H05K 1/117; H05K 2201/10128
See application file for complete search history.

(56) References Cited

U.S. PATENT DOCUMENTS

2006/0230659 A1* 10/2006 Hu .......................... G09F 13/22
40/544
2008/0076273 A1* 3/2008 Jang ..................... G02F 1/13452
439/56
(Continued)

FOREIGN PATENT DOCUMENTS

JP 2013-246345 12/2013
KR 10-2008-0048347 6/2008
(Continued)

*Primary Examiner* — Ismail A Muse
(74) *Attorney, Agent, or Firm* — F. Chau & Associates, LLC

(57) ABSTRACT

A display apparatus includes a display panel configured to display an image and including a first pad part, the first pad part including a plurality of first pads disposed at a first edge thereof, and a printed circuit board having an insertion hole in which at least a portion of the first edge of the first pad part is accommodated. The printed circuit board includes a plurality of first terminals disposed on an inner surface of the insertion hole to contact the plurality of first pads.

19 Claims, 15 Drawing Sheets

(51) Int. Cl.
  *H01L 23/48*  (2006.01)
  *H01L 27/12*  (2006.01)
  *H01L 23/00*  (2006.01)
  *H05K 1/11*  (2006.01)
  *H05K 1/18*  (2006.01)

(52) U.S. Cl.
  CPC .............. *H01L 2224/09181* (2013.01); *H05K 2201/10128* (2013.01)

(56) References Cited

U.S. PATENT DOCUMENTS

| | | | | |
|---|---|---|---|---|
| 2010/0051334 | A1* | 3/2010 | Ho ......................... | G11B 5/486 |
| | | | | 174/257 |
| 2012/0247824 | A1* | 10/2012 | Ohsawa ................. | G11B 5/486 |
| | | | | 174/264 |
| 2015/0357733 | A1* | 12/2015 | Sanford ................. | H01R 12/62 |
| | | | | 361/749 |
| 2016/0028174 | A1* | 1/2016 | Jung ...................... | H01R 12/88 |
| | | | | 439/77 |
| 2016/0227652 | A1* | 8/2016 | Clayton ................. | H05K 3/363 |
| 2016/0316577 | A1* | 10/2016 | Yamamoto ............. | G09G 5/006 |

FOREIGN PATENT DOCUMENTS

| | | |
|---|---|---|
| KR | 10-2008-0077068 | 8/2008 |
| KR | 10-2015-0069308 | 6/2015 |

\* cited by examiner

DISPLAY APPARATUS WITH CURVED CONTACTS

CROSS-REFERENCE TO RELATED APPLICATION

This U.S. non-provisional patent application claims priority under 35 U.S.C. § 119 to Korean Patent Application No. 10-2016-0019685, filed on Feb. 19, 2016, the disclosure of which is incorporated by reference herein in its entirety.

TECHNICAL FIELD

The present invention relates to a display apparatus, and more particularly, to a display apparatus that has a reduced manufacturing cost and a short manufacturing time.

DISCUSSION OF THE RELATED ART

In general, a display apparatus includes a display panel for displaying an image and a backlight unit for supplying light to the display panel. The display panel adjusts the transmittance of light supplied from the backlight unit to display an image.

To display an image, a plurality of thin film transistors, formed on the display panel, may receive driving voltages. The display panel may be connected to a printed circuit board through a connector such as an anisotropic conductive film (ACF).

SUMMARY

According to an exemplary embodiment of the present invention, a display apparatus includes a display panel configured to display an image and including a first pad part, the first pad part including a plurality of first pads disposed at a first edge thereof, and a printed circuit board having an insertion hole in which at least a portion of the first edge of the first pad part is accommodated. The printed circuit board includes a plurality of first terminals disposed on an inner surface of the insertion hole to contact the plurality of first pads.

According to an exemplary embodiment of the present invention, a display apparatus includes a display panel configured to display an image and including a first pad part on a first surface thereof, the first pad part including a plurality of first pads, and a printed circuit board having a first surface, a second surface, and a third surface connecting the first and second surfaces to each other. A plane on which the first surface is disposed is parallel to or forms an acute angle with respect to a plane on which the second surface is disposed. The first surface of the display panel is disposed between the first and second surfaces of the printed circuit board such that a plurality of first terminals, disposed on the first surface of the printed circuit board, are connected to the plurality of first pads.

BRIEF DESCRIPTION OF THE DRAWINGS

The above and other features of the present invention will become more apparent by describing in detail exemplary embodiments thereof in conjunction with the accompanying drawings, in which.

DETAILED DESCRIPTION OF THE EMBODIMENTS

Figure 1:
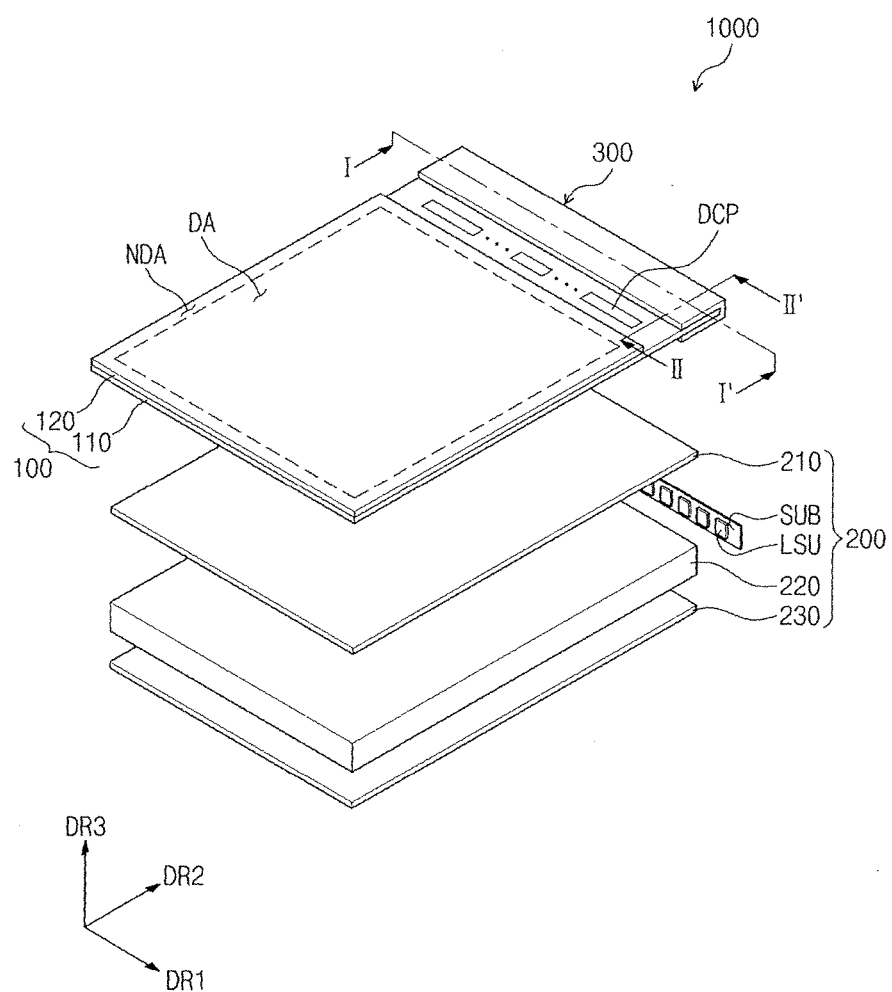
FIG. 1 is an exploded perspective view illustrating a display apparatus according to an exemplary embodiment of the present invention.

Exemplary embodiments of the present invention will be described more fully hereinafter with reference to accompanying drawings. The present invention may, however, be embodied in different forms and should not be construed as limited to the embodiments set forth herein. Like reference numerals may refer to like elements throughout the specification. The sizes or proportions of elements illustrated in the drawings may be exaggerated for clarity.

It will be understood that when an element such as a layer or substrate is referred to as being "on" another element, it can be directly on the other element, or intervening elements may also be present therebetween.

FIG. 1 is an exploded perspective view illustrating a display apparatus according to an exemplary embodiment of the present invention.

Referring to FIG. 1, a display apparatus 1000 includes a display panel 100, a backlight unit 200, and a printed circuit board 300.

The display panel 100 may be a liquid crystal display panel. However, the present invention is not limited thereto. For example, according to an exemplary embodiment of the present invention, the display panel 100 may be a different kind of display panel such as an organic electro luminescence display panel, an electrowetting display panel, a nano-crystal display panel, or the like. Also, in a display apparatus 1000 that includes an organic electro luminescence display panel 100, the backlight unit 200 may be omitted since the organic electro luminescence display panel 100 generates light by itself to display an image.

The display panel 100 may have a quadrangular plate shape having two pairs of sides. In an exemplary embodiment of the present invention, the display panel 100 may have a rectangular shape having a pair of long sides and a pair of short sides, as shown in FIG. 1. The display panel 100 may have the short sides extending in a first direction DR1 and the long sides extending in a second direction DR2, crossing the first direction DR1 on a plane.

The display panel 100 includes a display substrate 110 displaying an image by using light received from the backlight unit 200 and an opposite substrate 120 coupled to the display substrate 110 to face the display substrate 110. Upward and downward directions may be parallel to a third direction DR3. The third direction DR3 is normal to a plane formed by the first and second directions DR1 and DR2. The third direction DR3 may be a reference direction for distinguishing front and rear surfaces of components that will be described below.

The display panel 100 may further include a liquid crystal layer disposed between the display substrate 110 and the opposite substrate 120.

The display substrate 110 includes pixels, gate lines, data lines, and thin film transistors formed thereon.

The gate lines and the data lines cross each other on the display substrate 110. Areas on which the gate lines cross the data lines may be defined as pixel areas. A thin film transistor and a pixel electrode connected to the thin film transistor are disposed in a pixel area.

An area on the plane on which the display panel 100 is disposed includes a display area DA, on which the pixels are disposed, and a non-display area NDA, surrounding the display area DA.

According to an exemplary embodiment of the present invention, the display substrate 110 has long sides which are greater than the long sides of the opposite substrate 120. For example, the display substrate 110 has a size that is relatively greater than that of the opposite substrate 120.

In an exemplary embodiment of the present invention, the display substrate 110, except for a side of the display substrate 110 in the second direction DR2, may overlap the opposite substrate 120. The area on which the display substrate 110 overlaps the opposite substrate 120 includes the display area DA.

Figure 2A:
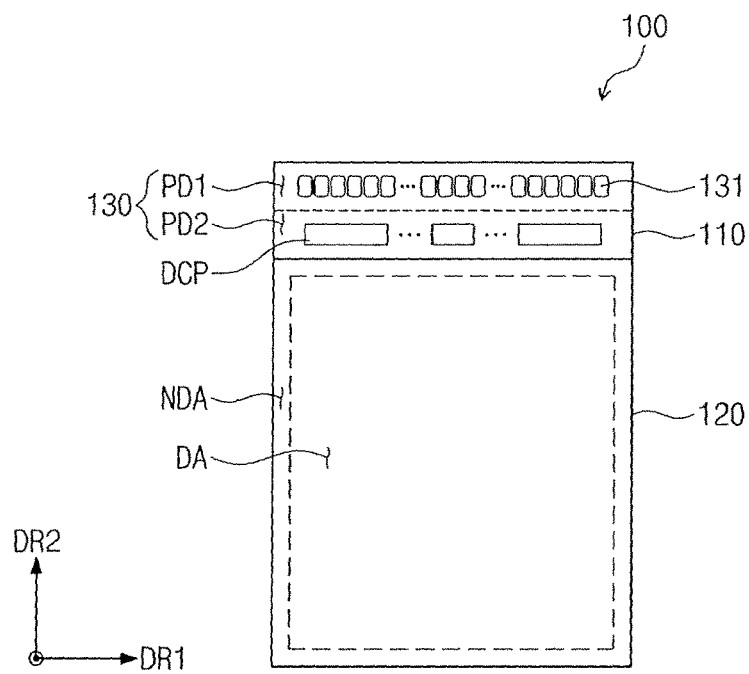
FIG. 2A is a plan view illustrating a display panel according to an exemplary embodiment of the present invention.

The display panel 100 may further include a pad part 130 (see FIG. 2A). The pad part 130 is disposed at an area of the area of the display substrate 110 which does not overlap the opposite substrate 120. For example, the pad part 130 may be disposed on a side of the display substrate 110 in the second direction DR2.

The printed circuit board 300 extends in the first direction DR1. The printed circuit board 300 overlaps a side of the display panel 100 in the second direction DR2. The printed circuit board 300 has a bent shape to surround a side of the display substrate 110.

The pad part 130 and the printed circuit board 300 will be described in more detail with reference to FIGS. 2A and 4B.

The backlight unit 200 is disposed at a rear side of the display panel 100 to provide light the display panel 100. In the exemplary embodiment described with reference to FIG. 1, the backlight unit 200 may have an edge-type structure. The backlight unit 200 includes a light source LSU, an optical member 210, a light guide plate 220, and a reflection sheet 230.

Each of the display panel 100, the optical member 210, the light guide plate 220, and the reflection sheet 230 has short sides in the first direction DR1 and long sides in the second direction DR2.

The light source LSU is disposed adjacent to a side surface of the light guide plate 220. In the exemplary embodiment described with reference to FIG. 1, the light source LSU is disposed adjacent to a side surface of the light guide plate 220 in the second direction DR2. The reflection sheet 230 is disposed above the light guide plate 220, and the optical member 210 may be disposed above the light guide plate 220. The display panel 100 is disposed above the optical member 210.

In the exemplary embodiment described with reference to FIG. 1 it is illustrated that the light source LSU is disposed adjacent to one of the side surfaces of the light guide plate 220. However, the present invention is not limited to this arrangement of the light source LSU or to the number of light sources LSU. For example, in an exemplary embodiment of the present invention, a plurality of light sources LSU may be disposed on one or more side surfaces of the light guide plate 220. For example, a first light source LSU and a second light source LSU may be disposed on adjacent side surfaces of the light guide plate 220.

The light source LSU generates light to be provided to the display panel 100 through the light guide plate 220. The light source LSU includes a light source substrate SUB and a plurality of light source units LSU mounted on the light source substrate SUB.

The light source substrate SUB extends in the first direction DR1. The light source units LSU are disposed on a side surface of the light source substrate SUB. The light source units LSU may be arranged in the first direction DR1.

The light source units LSU generate light. The light generated by the light source units LSU is provided to the light guide plate 220.

The light guide plate 220 changes a traveling direction of the light provided from the light source units LSU so that the light travels in an upward direction, e.g., in a direction in which the display panel 100 is disposed. The light guide plate 220 may include a material having a high light transmittance in a visible ray region. For example, the light guide plate 220 may include polymethylmethacrylate (PMMA).

The optical member 210 is disposed above the light guide plate 220. The light guided upward by the light guide plate 220 may be diffused and collected by the optical member 210 and then provided to the display panel 100. The optical member 210 may include a diffusion sheet, a prism sheet, and a protection sheet.

The reflection sheet 230 is disposed below the light guide plate 220. The reflection sheet 230 reflects the light emitted to a lower side of the light guide plate 220 so that the light is emitted upward. The reflective sheet 230 includes a light reflecting material.

FIG. 2A is a plan view illustrating a display panel according to an exemplary embodiment of the present invention.

Referring to FIG. 2A, the display substrate 110 may be bonded to the opposite substrate 120. For example, the opposite substrate 120 may be bonded to an area of the display substrate 110 which does not overlap the pad part 130.

The pad part 130 includes a first pad part PD1 and a second pad part PD2. The first pad part PD1 is disposed on a side of the pad part 130 in the second direction DR2, and the second pad part PD2 is disposed on another side of the pad part 130 in the second direction DR2.

The first pad part PD1 includes a plurality of pads 131. The first pads 131 may be arranged in the first direction DR1.

The display panel 100 may further include at least one driving chip DCP. The driving chip DCP is disposed on the second pad part PD2. The driving chip DCP may be electrically connected to the first and second pad parts PD1 and PD2 to provide signals to the gate lines or the data lines.

Figure 2B:
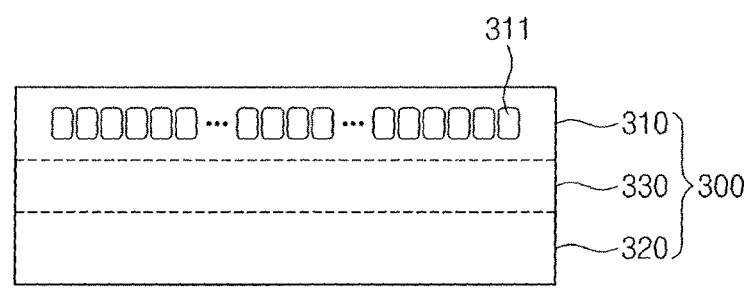
FIG. 2B is a plan view illustrating a printed circuit board according to an exemplary embodiment of the present invention.

FIG. 2B is a plan view illustrating a printed circuit board according to an exemplary embodiment of the present invention.

Referring to FIG. 2B, the printed circuit board 300 includes an upper end 310, a lower end 320, and a bent portion 330. The upper end 310 is connected to the lower end 320 through the bent portion 330. The printed circuit board 300 may have an integrated shape by connecting the upper end 310, the lower end 320, and the bent portion 330 to each other. For example, the printed circuit board 300 has a continuous structure including the upper end 310, the lower end 320, and the bent portion 330.

The upper end 310 includes a plurality of first terminals 311. The first terminals 311 may be arranged in the first direction DR1.

Figure 3:
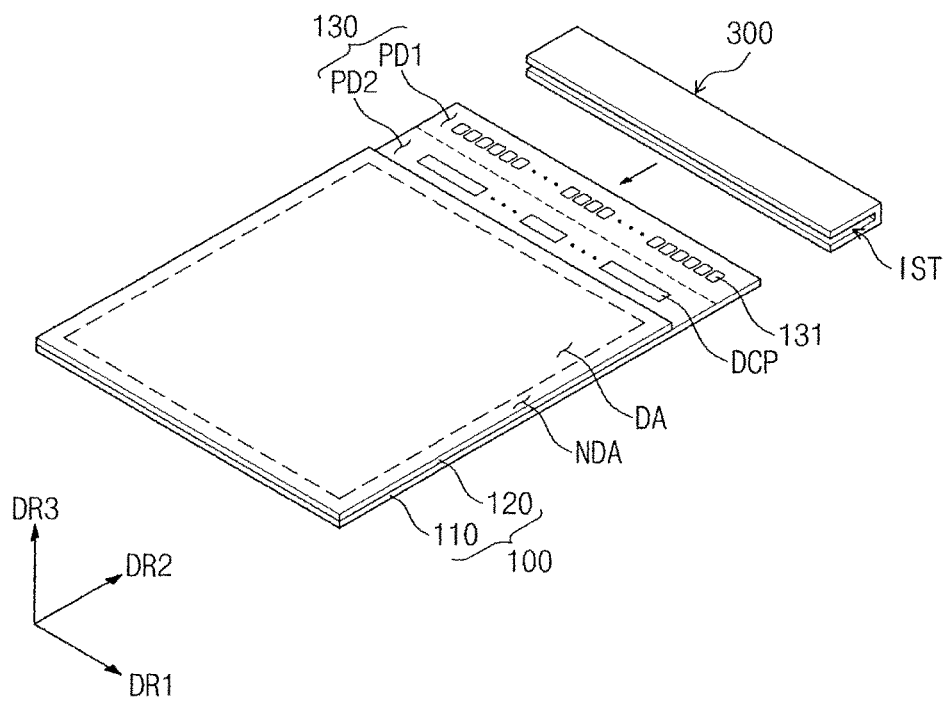
FIG. 3 is a perspective view illustrating a state in which a printed circuit board is being inserted into a display panel according to an exemplary embodiment of the present invention.
Figure 4A:
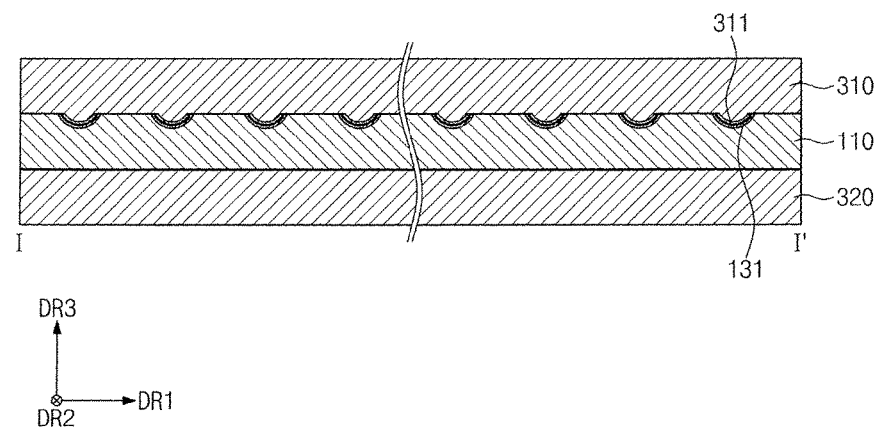
FIG. 4A is a cross-sectional view taken along line I-I' of FIG. 1 according to an exemplary embodiment of the present invention.

FIG. 3 is a perspective view illustrating a state in which a printed circuit board is being inserted into a display panel according to an exemplary embodiment of the present invention. FIG. 4A is a cross-sectional view taken along line I-I' of FIG. 1 according to an exemplary embodiment of the present invention. FIG. 4B is a cross-sectional view taken along line II-II' of FIG. 1 according to an exemplary embodiment of the present invention.

Figure 4B:
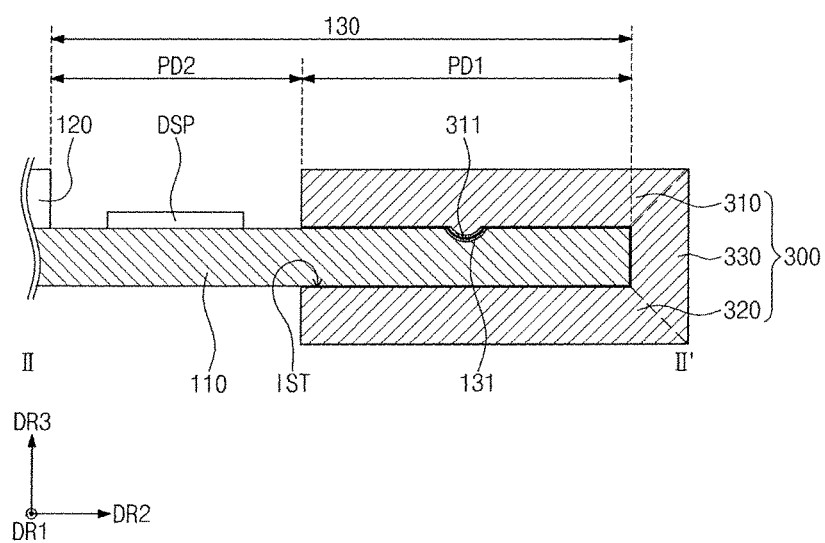
FIG. 4B is a cross-sectional view taken along line II-II' of FIG. 1 according to an exemplary embodiment of the present invention.

Referring to FIGS. 3, 4A, and 4B, the printed circuit board 300 extends in the first direction DR1 and is disposed adjacent to a side of the display substrate 110 in the second direction DR2.

The printed circuit board 300 has a shape that is bent in a certain direction. An insertion hole IST may be a space inside of the printed circuit board 300, as shown in FIG. 3. According to an exemplary embodiment of the present invention, the insertion hole IST may be formed by bending the printed circuit board 300 in the second direction D2 along the dotted lines of FIG. 2B. The insertion hole IST accommodates a portion of the display substrate 110 on which the first pad part PD1 is disposed. The portion of the display substrate 110, on which the first pad part PD1 is disposed, may be slid in the second direction DR2 and then inserted into the insertion hole IST. Alternatively, the printed circuit board 300 may be slid in the second direction DR2 onto the first pad part PD1 such that the first pad part PD1 fills the insertion hole IST. Although the planes on which the upper end 310 and the lower end 320 are respectively disposed are illustrated as being parallel to each other, the present invention is not limited thereto. For example, in an exemplary embodiment of the present invention, a first plane, on which the upper end 310 is disposed, and a second plane, on which the lower end 320 is disposed, may form an acute angle with respect to each other.

The upper end 310 and the lower end 320 of the printed circuit board 300 overlap the first pad part PD1 of the display substrate 110. An inner surface of the upper end 310 may contact a front surface of the display substrate 110, which overlaps the area on which the first pad part PD1 is disposed. An inner surface of the lower end 320 may contact a rear surface of the display substrate 110, which overlaps the area on which the first pad part PD1 is disposed.

The bent portion 330 extends downward, in the second direction DR3, from a side of the upper end 310 to a side of the lower end 320.

The second pad part PD2 may be exposed to the outside (e.g., another element).

The upper end 310 of the printed circuit board 300 may include the first terminals 311 on the inner surface of the upper end 310. Each of the first terminals 311 may contact one of the first pads 131. For example, each of the first terminals 311 may contact a corresponding first pad 131.

Each of the first pads 131 has a concave shape, and each of the first terminals 311 has a convex shape. The first pads 131 may be engaged with the first terminals 311.

Each of the first pads 131 and the first terminals 311 may include a conductive material. Thus, the first pads 131 may be electrically connected to the first terminals 311.

When a pad part and a printed circuit board are bonded to each other through a thermal compression bonding process, the pad part and the printed circuit board are bonded to each other through a connector such as a tape carrier package (TCP). Bonding parts disposed on both ends of the connector are compressed against the pad part and the printed circuit board, respectively. In this process, the bonding parts of the connector may be damaged by heat and pressure to cause defects. However, according to an exemplary embodiment of the present invention, the first pads 131 of the pad part 130 and the first terminals 311 of the printed circuit board 300 may be coupled to each other without a separate bonding process. Thus, the connector, which connects the pad part 130 to the printed circuit board 300, may be omitted to reduce manufacturing costs and simplify the manufacturing process.

In addition, according to an exemplary embodiment of the present invention, since the electrical connection between the first pads 131 of the pad part 130 and the first terminals 311 is achieved without subjecting the first pads 131 and the first terminals 311 to heat and pressure, the occurrence of defects due to the use of heat or pressure may be prevented.

In addition, according to an exemplary embodiment of the present invention, since the coupling of the first pads 131 and the first terminals 311 may be simplified, an occurrence of short-circuit due to misalignment of the first pads 131 and the first terminals 311 may be prevented.

Figure 5:
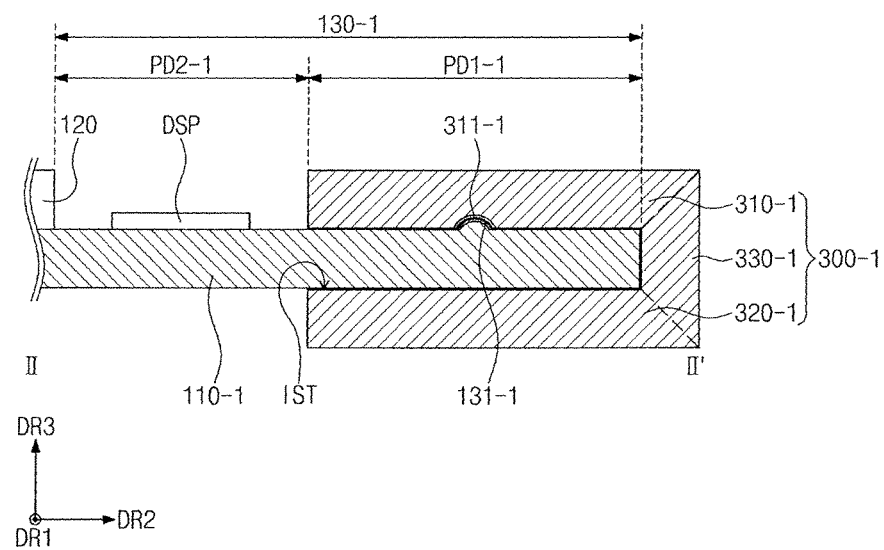
FIG. 5 is a cross-sectional view illustrating a display panel and a printed circuit board according to an exemplary embodiment of the present invention.

FIG. 5 is a cross-sectional view illustrating a display panel and a printed circuit board according to an exemplary embodiment of the present invention.

Referring to FIG. 5, each of first pads 131-1 may have a convex shape, and each of first terminals 311-1 may have a concave shape. The first pads 131-1 may be engaged with the first terminals 311-1 in a male/female coupling manner.

Each of the first pads 131-1 and the first terminals 311-1 may include a conductive material. Thus, the first pads 131-1 may be electrically connected to the first terminals 311-1.

Figure 6:
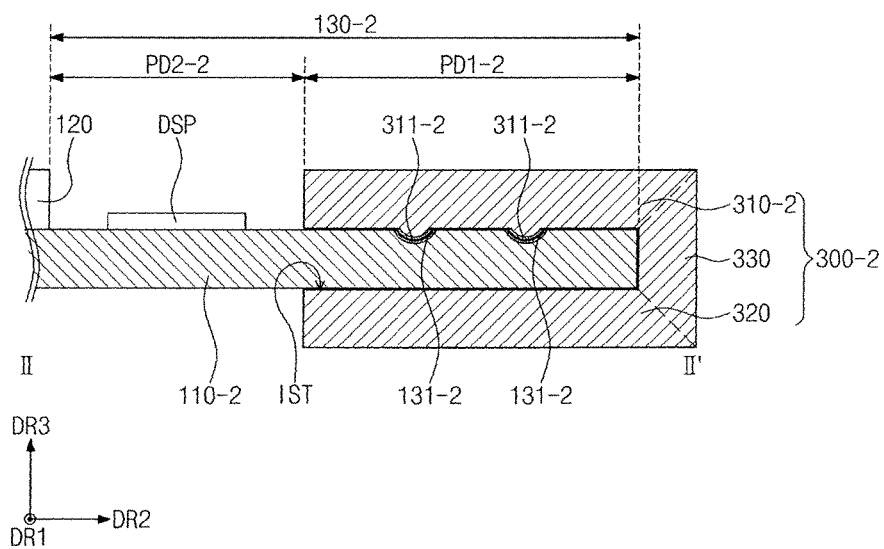
FIG. 6 is a cross-sectional view illustrating a display panel and a printed circuit board according to an exemplary embodiment of the present invention.

FIG. 6 is a cross-sectional view illustrating a display panel and a printed circuit board according to an exemplary embodiment of the present invention.

Referring to FIG. 6, first pads 131-2 may be arranged in the form of a matrix on an area of a first pad part PD1-2. For example, the first pads 131-2 may be arranged in a plurality of rows in the first direction DR1 and in a plurality of columns in the second direction DR2.

First terminals 311-2 may be arranged in the form of a matrix on an area of an inner surface of an upper portion 310-2 of a printed circuit board 300-2. For example, the first terminals 311-2 may be arranged in a plurality of rows in the first direction DR1 and in a plurality of columns in the second direction DR2.

Each of the first pads 131-2 may have a concave shape, and each of the first terminals 311-2 may have a convex shape. The first pads 131-2 may be engaged with the first terminals 311-2 in a male/female coupling manner.

Each of the first pads 131-2 and the first terminals 311-2 may include a conductive material. Thus, the first pads 131-2 may be electrically connected to the first terminals 311-2.

Figure 7A:
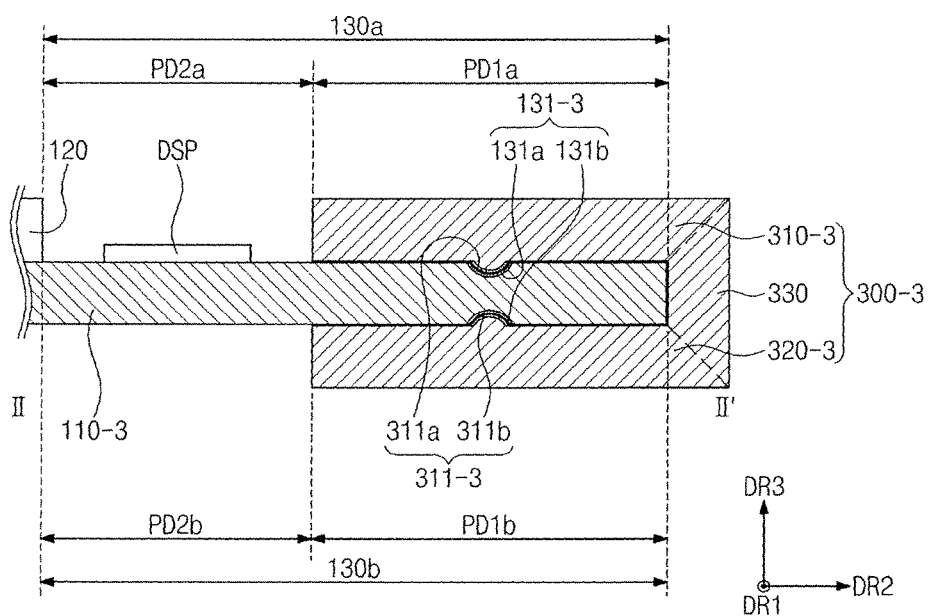
FIG. 7A is a cross-sectional view illustrating a display panel and a printed circuit board according to an exemplary embodiment of the present invention.
Figure 7B:
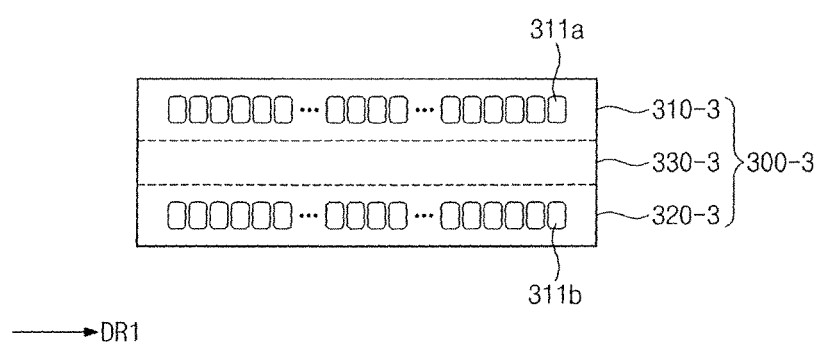
FIG. 7B is a plan view illustrating the printed circuit board of FIG. 7A according to an exemplary embodiment of the present invention.

FIG. 7A is a cross-sectional view illustrating a display panel and a printed circuit board according to an exemplary embodiment of the present invention. FIG. 7B is a plan view illustrating the printed circuit board of FIG. 7A according to an exemplary embodiment of the present invention.

Referring to FIGS. 7A and 7B, a plurality of pad parts, for example, pad parts 130a and 130b, may be disposed on a display substrate 110-3. For example, the two pad parts 130a and 130b may be respectively disposed on front and rear surfaces of the display substrate 110-3. Thus, the pad part disposed on the front surface of the display substrate 110-3 may be the front pad part 130a, and the pad part disposed on the rear surface of the display substrate 110-3 may be the rear pad part 130b. The front pad part 130a and the rear pad part 130b may include the first pads 131-3, as shown in FIG. 7A.

The front pad part 130a includes a first front pad part PD1a and a second front pad part PD2a, and the rear pad part 130b includes a first rear pad part PD1b and a second rear pad part PD2b.

The first front pad part PD1a includes a plurality of first sub pads 131a. The first rear pad part PD1b includes a plurality of second sub pads 131b.

Each of the first sub pads 131a and the second sub pads 131b has a concave shape. For example, each of the first sub pads 131a has a shape that is recessed downward, and each of the second sub pads 131b has a shape that is recessed upward.

A printed circuit board 300-3, according to an exemplary embodiment of the present invention, has an upper end 310-3, including a plurality of sub terminals 311a, and a lower end 320-3, including a plurality of second sub terminals 311b.

Each of the first sub terminals 311a and the second sub terminals 311b has a convex shape. For example, each of the first sub terminals 311a has a shape that protrudes downward, and each of the second sub terminals 311b has a shape that protrudes upward.

The first sub pads 131a may be engaged with the first sub terminals 311a in a male/female coupling manner. The second sub pads 131b may be engaged with the second sub terminals 311b in the male/female coupling manner.

The present invention is not limited to the shape of each of the first and second sub pads 131a and 131b and the first and second sub terminals 311a and 311b. For example, the first and second sub pads 131a and 131b, respectively, may have shapes that can be coupled to the first and second sub terminals 311a and 311b. For example, according to an exemplary embodiment of the present invention, each of the first and second sub pads 131a and 131b may have a convex shape, and each of the first and second sub terminals 311a and 311b may have a concave shape. According to an exemplary embodiment of the present invention, each of the first and second sub pads 131a and 131b may have a concave shape, and each of the first and second sub terminals 311a and 311b may have a convex shape. However, it is understood that the first and second sub pads 131a and 131b and the first and second sub terminals 311a and 311b may have other shapes including protrusions and recesses that can be coupled to each other.

Each of the first and second sub pads 131a and 131b and the first and second sub terminals 311a and 311b may include a conductive material. Thus, the first sub pads 131a may be electrically connected to the first sub terminals 311a, and the second sub pads 131b may be electrically connected to the second sub terminals 311b.

According to an exemplary embodiment of the present invention, first pads 131-3 are disposed on the front and rear surfaces of the display substrate 110-3. Thus, a mounting area may increase when compared to a case in which the first pads 131-3 are disposed only on the front surface of the display substrate 110-3. Therefore, an area occupied by the pad part 130a on a plane may be reduced. As a result, a bezel area of the display apparatus 1000 may be reduced.

Figure 8A:
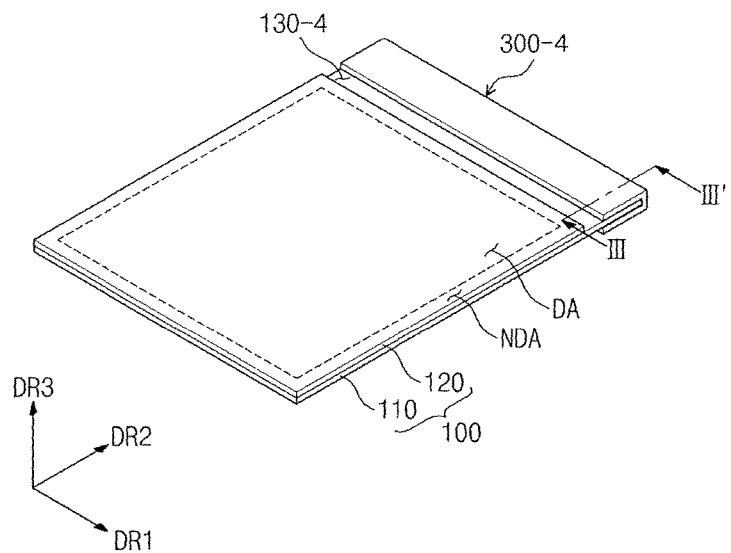
FIG. 8A is a perspective view illustrating a display panel and a printed circuit board according to an exemplary embodiment of the present invention.
Figure 8B:
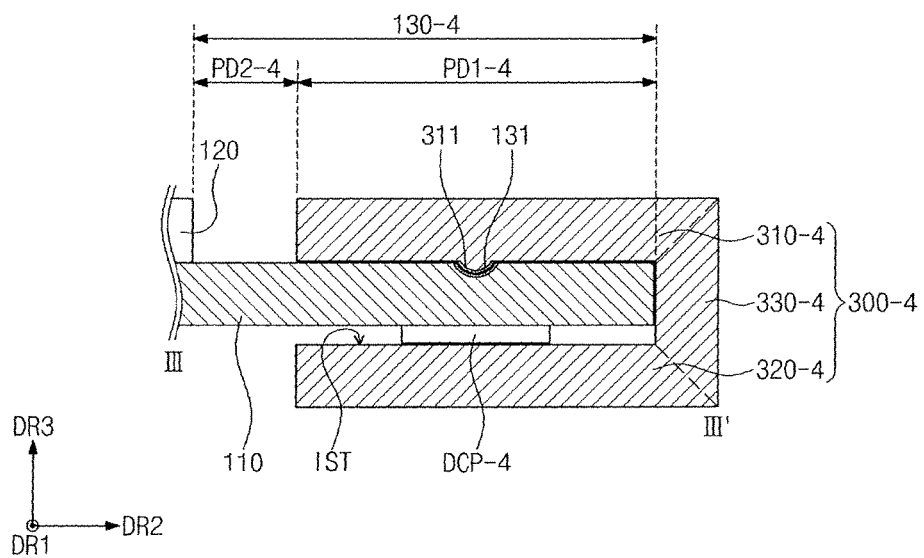
FIG. 8B is a cross-sectional view taken along line III-III' of FIG. 8A according to an exemplary embodiment of the present invention.

FIG. 8A is a perspective view illustrating a display panel and a printed circuit board according to an exemplary embodiment of the present invention. FIG. 8B is a cross-sectional view taken along line III-III' of FIG. 8A according to an exemplary embodiment of the present invention.

Referring to FIGS. 8A and 8B, a driving chip DCP-4 is disposed between a display substrate 100 and a lower end 320-4 of a printed circuit board 300-4. For example, a driving chip DCP-4 may have a front surface contacting a rear surface of the display substrate 110 and a rear surface contacting an inner surface of the lower end 320-4. When the driving chip DCP-4 is mounted as a chip on glass (COG), the driving chip DCP-4 may be electrically connected to a first pad part PD1-4 of the display substrate 110. When the driving chip DCP-4 is mounted as a chip on board (COB), the driving chip DCP-4 may be electrically connected to the lower end 320-4 of the printed circuit board 300-4.

According to an exemplary embodiment of the invention concept, since the driving chip DCP-4 is disposed on the rear surface of the display substrate 110, a second pad part PD2-4 may be reduced in area. Accordingly, a bezel area of the display apparatus 1000 may be reduced.

Figure 9A:
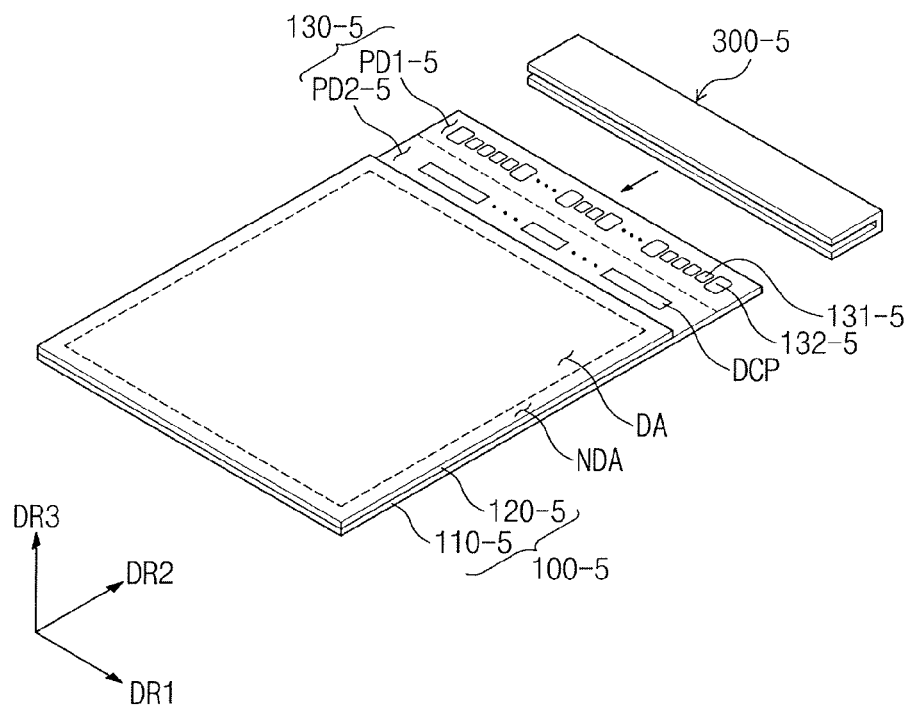
FIG. 9A is a perspective view illustrating a state in which a printed circuit board is being inserted into a display panel according to an exemplary embodiment of the present invention.
Figure 9B:
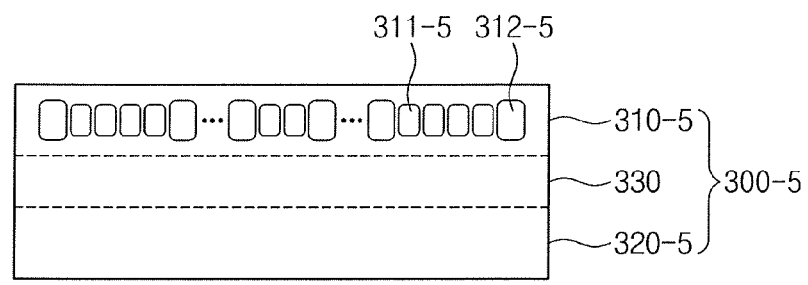
FIG. 9B is a plan view illustrating the printed circuit board of FIG. 9A according to an exemplary embodiment of the present invention.
Figure 9C:
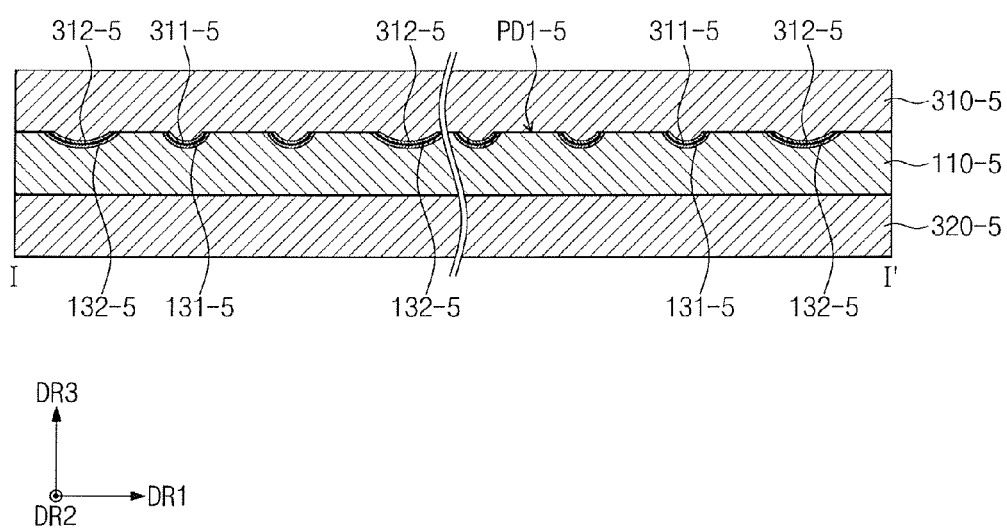
FIG. 9C is a cross-sectional view illustrating the display panel and the printed circuit board of FIG. 9A according to an exemplary embodiment of the present invention.

FIG. 9A is a perspective view illustrating a state in which a printed circuit board is being inserted into a display panel according to an exemplary embodiment of the present invention. FIG. 9B is a plan view illustrating the printed circuit board of FIG. 9A according to an exemplary embodiment of the present invention. FIG. 9C is a cross-sectional view illustrating the display panel and the printed circuit board of FIG. 9A according to an exemplary embodiment of the present invention Referring to FIGS. 9A to 9C, a first pad part PD1-5 of a pad part 130-5 includes a plurality of first pads 131-5 and a plurality of guide pads 132-5. The guide pads 132-5 are arranged in the first direction DR1. A plurality of first pads 131-5 may be disposed between a pair of adjacent guide pads 132-5.

Each of the guide pads 132-5 may have an area greater than that of each of the first pads 131-5.

An upper end 310-5 of the printed circuit board 300-5, according to an exemplary embodiment of the present invention, includes a plurality of first terminals 311-5 and a plurality of guide terminals 312-5. The guide terminals 312-5 are arranged in the first direction DR1. A plurality of first terminals 311-5 may be disposed between an adjacent pair of guide terminals 312-5.

Each of the guide terminals 312-5 may have an area greater than that of each of the first terminals 312-5.

Each of the guide pads 132-5 may contact one of the guide terminals 312-5.

Each of the guide pads 132-5 has a concave shape, and each of the guide terminals 312-5 has a convex shape. The guide pads 132-5 may be engaged with the guide terminals 312-5 in a male/female coupling manner.

The guide pads 132-5 and the guide terminals 312-5 may guide the display substrate 110-5 so that the first pads 131-5 may be coupled to the first terminals 311-5.

Each of the guide pads 132-5 and the guide terminals 312-5 may include a conductive material. Thus, the guide pads 132-5 may be electrically connected to the guide terminals 312-5. However, according to an exemplary embodiment of the present invention, each of the guide pads 132-5 and the guide terminals 312-5 may not include the conductive material. For example, the guide pads 132-5 and the guide terminals 312-5 may not electrically connect the pad part 130-5 to the printed circuit board 300-5. Dummy pads and dummy terminals may guide the first pads 131-5 and the first terminals 311-5, respectively.

In addition, according to an exemplary embodiment of the present invention, when the display substrate 110-5 is inserted into the printed circuit board 300-5, the first pads 131-5 may be more easily coupled to the first terminals 311-5.

Figure 10A:
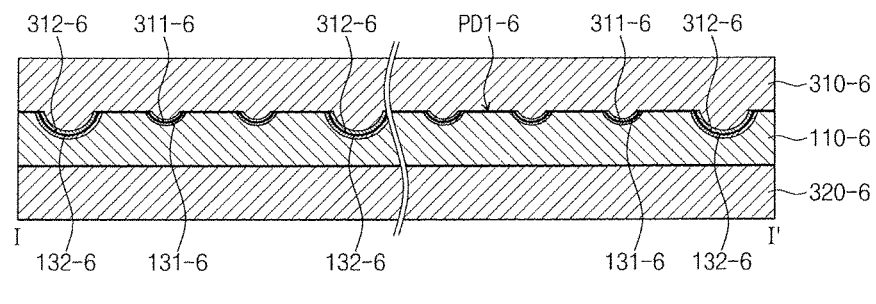
FIG. 10A is a cross-sectional view illustrating a display panel and a printed circuit board according to an exemplary embodiment of the present invention.

FIG. 10A is a cross-sectional view illustrating a display panel and a printed circuit board according to an exemplary embodiment of the present invention.

Referring to FIG. 10A, a concave shape of each of guide pads 132-6 has a depth greater than that of a concave shape of each of first pads 131-6. Also, a convex shape of each of the guide terminals 312-6 has a height greater than that of a convex shape of each of the first pads 311-6.

The guide pads 132-6 and the guide terminals 312-6 may guide the display substrate 110-6 so that the first pads 131-6 are coupled to the first terminals 311-6.

Each of the guide pads 132-6 and the guide terminals 312-6 may include a conductive material. Thus, the guide pads 132-6 may be electrically connected to the guide terminals 312-6. However, according to an exemplary embodiment of the present invention, each of the guide pads 132-6 and the guide terminals 312-6 may not include the conductive material.

Figure 10B:
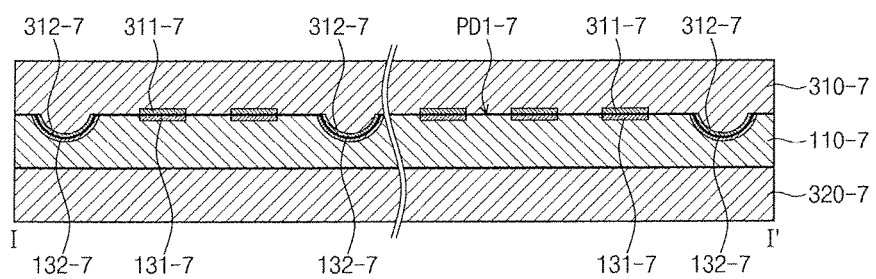
FIG. 10B is a cross-sectional view illustrating a display panel and a printed circuit board according to an exemplary embodiment of the present invention.

FIG. 10B is a cross-sectional view illustrating a display panel according to an exemplary embodiment of the present invention.

Referring to FIG. 10B, each of first pads 131-7 and first terminals 311-7 has a flat shape.

Each of guide pads 132-7 has a concave shape, and each of guide terminals 312-7 has a convex shape.

The guide pads 132-7 and the guide terminals 312-7 may guide a display substrate 110-7 so that the first pads 131-7 are coupled to the first terminals 311-7. For example, when the display substrate 110-7 is inserted into a printed circuit board 300-7, the guide pads 132-7 may be engaged with the guide terminals 312-7 in a male/female coupling manner. In this case, the first pads 131-7 may contact the first terminals 311-7. For example, the first pads 131-7 may be electrically connected to the first terminals 311-7.

Each of the guide pads 132-7 and the guide terminals 312-7 may include a conductive material. Thus, the guide pads 132-7 may be electrically connected to the guide terminals 312-7. However, according to an exemplary embodiment of the present invention, each of the guide pads 132-7 and the guide terminals 312-7 may not include the conductive material.

Figure 11A:
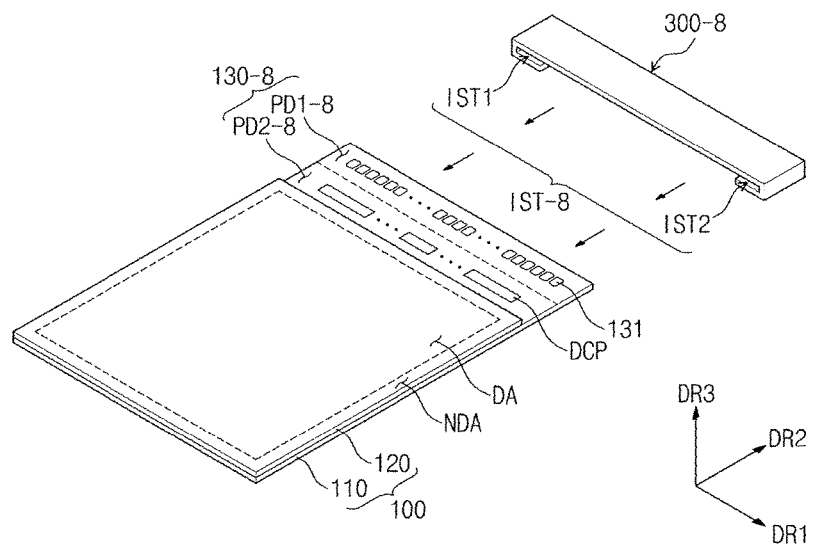
FIG. 11A is a perspective view illustrating a state in which a printed circuit board is being inserted into a display panel according to an exemplary embodiment of the present invention.
Figure 11B:
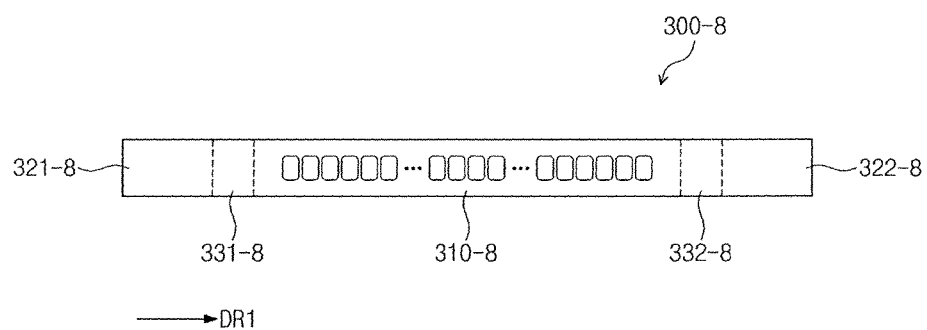
FIG. 11B is a plan view illustrating the printed circuit board of FIG. 11A according to an exemplary embodiment of the present invention.

FIG. 11A is a perspective view illustrating a state in which a printed circuit board is being inserted into a display panel according to an exemplary embodiment of the present invention. FIG. 11B is a plan view illustrating the printed circuit board of FIG. 11A according to an exemplary embodiment of the present invention.

Figure 12A:
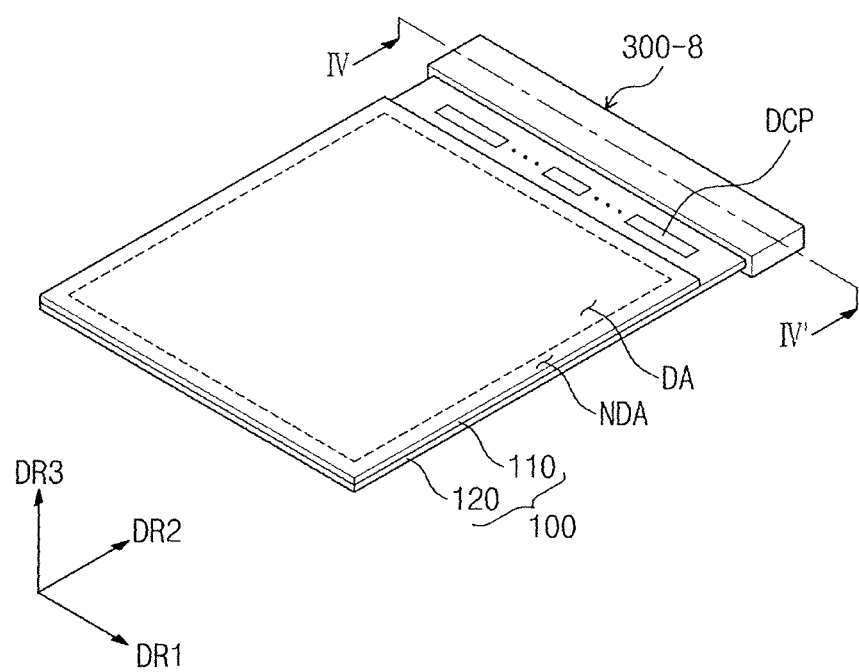
FIG. 12A is a perspective view illustrating the display panel and the printed circuit board of FIG. 11A according to an exemplary embodiment of the present invention.
Figure 12B:
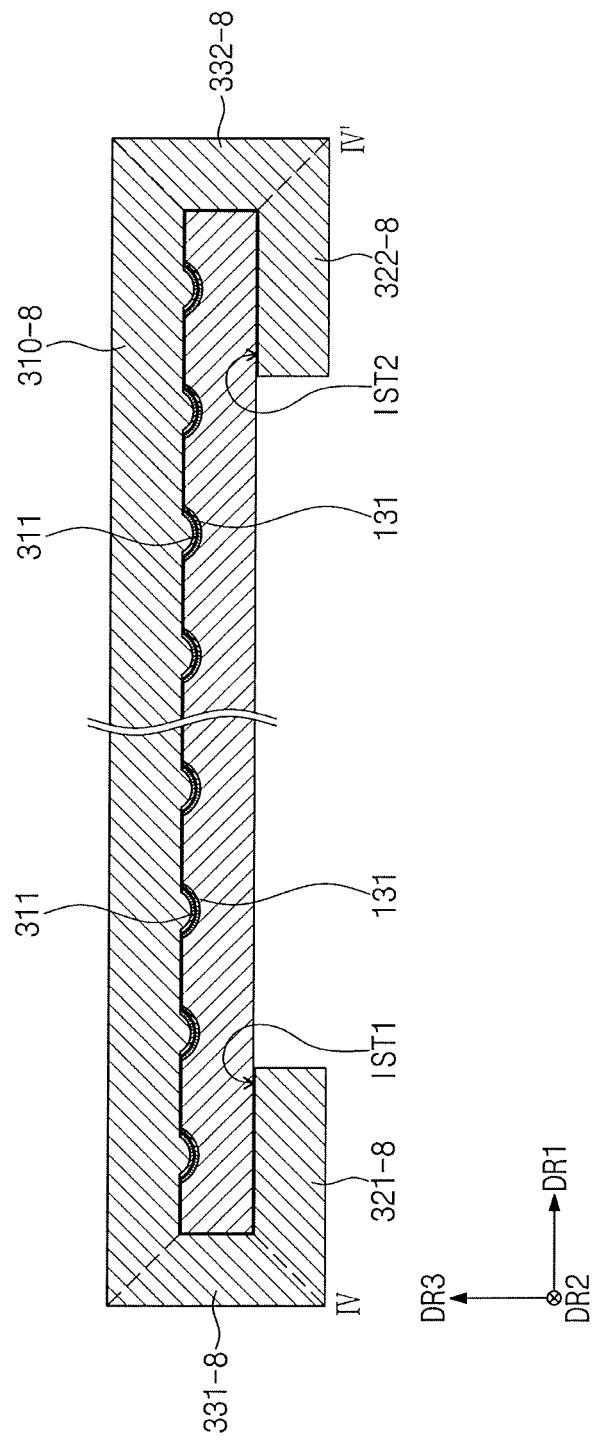
FIG. 12B is a cross-sectional view taken along line IV-IV' of FIG. 12A according to an exemplary embodiment of the present invention.

FIG. 12A is a perspective view illustrating the display panel and the printed circuit board of FIG. 11A according to an exemplary embodiment of the present invention. FIG. 12B is a cross-sectional view taken along line IV-IV' of FIG. 12A according to an exemplary embodiment of the present invention.

Referring to FIGS. 11A to 12B, a printed circuit board 300-8 extends in the first direction DR1. The printed circuit board 300-8 overlaps a side of a display panel 100 in the second direction DR2. The ends of the printed circuit board 300-8, in the first direction DR1, are bent to surround a side of the display substrate 110.

For example, the printed circuit board 300-8 includes an upper end 310-8, a lower end, and a bent portion. The upper end 310-8 is connected to the lower end through the bent portion. The printed circuit board 300-8 may have an integrated shape by connecting the upper end 310-8, the lower end, and the bent portion to each other. For example, the printed circuit board 300-8 has a continuous structure including the upper end 310-8, the lower end, and the bent portion.

The upper end 310-8 extends in the first direction DR1 to overlap a first pad part PO1-8, disposed on one side of the display substrate 110.

The lower end of the printed circuit board 300-8 includes a first sub lower end 321-8 and a second sub lower end 322-8. The first sub lower end 321-8 and the second sub lower end 322-8 overlap the upper end 310-8. In addition, the first sub lower end 321-8 overlaps a first side of the upper end 310-8 in the first direction DR1, and the second sub lower end 322-8 overlaps a second side of the upper end 310-8, which is opposite to the first side of the upper end 310-8, in the first direction DR1. The first sub lower end 321-8 and the second sub lower end 322-8 are disposed to be spaced apart from each other.

The bent portion of the printed circuit board 300-8 includes a first bent portion 331-8 and a second bent portion 332-8. The first bent portion 331-8 extends downward in the third direction DR3 from a first side of the upper end 310-8 to the first sub lower end 321-8. The second bent portion 332-8 extends downward in the third direction DR3 from a second side of the upper end 310-8, opposite to the first side of the upper end 310-8, to the second sub lower end 322-8.

According to the exemplary embodiments of the present invention described with reference to FIGS. 11A-12B, an insertion hole IST-8 may be defined by bending both ends of the printed circuit board 300-8 to face each other in the first direction DR1. A portion of the display substrate 110 on which the first pad part FD1-8 is disposed may be slid in the second direction DR2 to be inserted into the insertion hole IST-8.

The insertion hole IST-8 includes a first sub insertion hole IST1 and a second sub insertion hole IST2. Spaces defined by bending both ends of the printed circuit board 300-8, in the first direction DR1, may be defined as the first and second sub insertion holes IST1 and IST2, respectively. For example, a space defined between the upper end 310-8 and the first sub lower end 321-8 by the first bent portion 331-8 may be defined as the first sub insertion hole IST1, and a space defined between the upper end 310-8 and the second sub lower end 322-8 by the second bent portion 332-8 may be defined as the second sub insertion holes IST2.

Figure 13A:
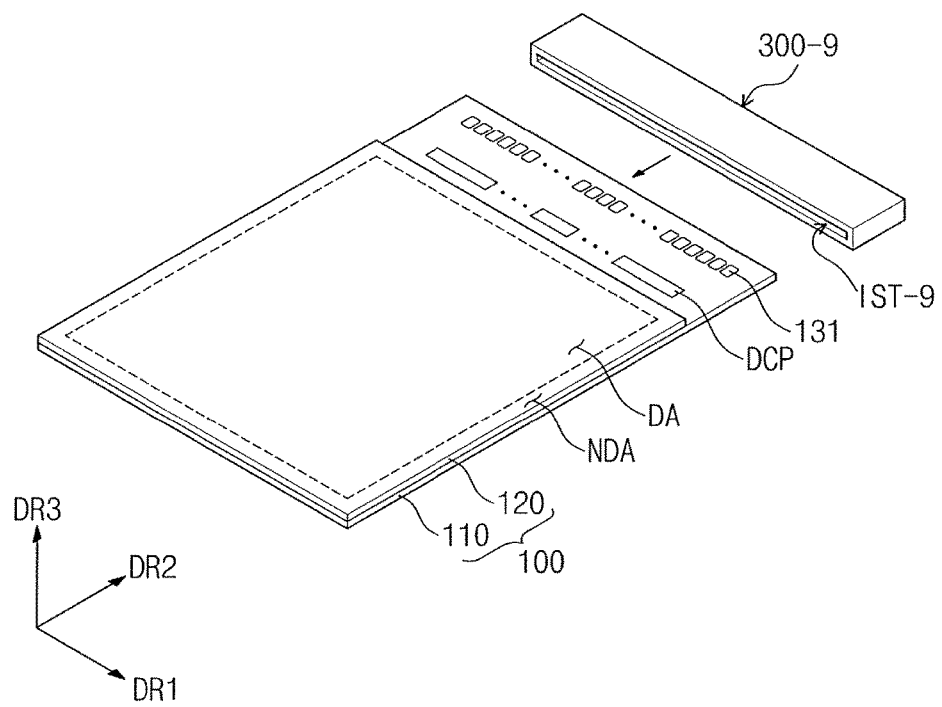
FIG. 13A is a perspective view illustrating a state in which a display panel is being inserted into a printed circuit board according to an exemplary embodiment of the present invention.
Figure 13B:
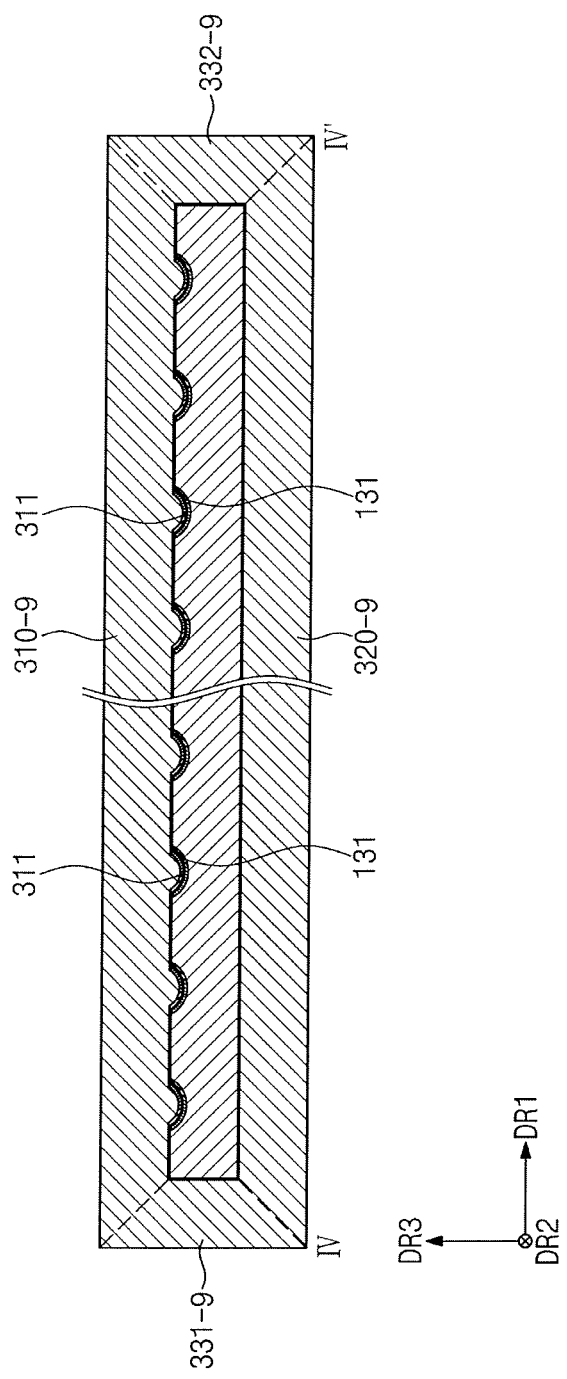
FIG. 13B is a cross-sectional view illustrating the display panel and the printed circuit board of FIG. 13A according to an exemplary embodiment of the present invention.

FIG. 13A is a perspective view illustrating a state in which a printed circuit board is being inserted into a display panel according to an exemplary embodiment of the present invention. FIG. 13B is a cross-sectional view illustrating the display panel and the printed circuit board of FIG. 13A according to an exemplary embodiment of the present invention.

Referring to FIGS. 13A and 13B, a printed circuit board 300-9 includes an upper end 310-9, a lower end 320-9, and a bent portion. The bent portion includes a first bent portion 331-9 and a second bent portion 332-9. The first bent portion 331-9 and the second bent portion 332-9 are disposed at opposite ends of the upper end 310-9 and the lower end 320-9 in the first direction DR1. The printed circuit board 300-9 may have an integrated shape by having the upper end 310-9, the lower end 320-9, and the first and second bent portions 331-9 and 332-9 connected to each other. For example, the printed circuit board 300-9 has a continuous structure including the upper end 310-9, the lower end 320-9, and the first and second bent portions 331-9 and 332-9.

The first bent portion 331-9 extends downward, in the third direction DR3, from a first side of the upper end 310-9 to a first side of the lower end 320-9. As shown in FIGS. 13A and 13B, the second bent portion 332-9 extends downward, in the third direction DR3, from a second side of the upper end 310-9, opposite to the first side of the upper end 310-9, to a second side of the lower end 320-9, opposite to the first side of the lower end 320-9.

Therefore, in the present invention, since heat or pressure is not applied to the first pads 131 and the first terminals 311, the occurrence of the defects due to the heat or pressure may be prevented. In addition, the coupling of the first pads 131 and the first terminals 311 may be facilitated. Thus, an occurrence of short circuit due to a misalignment of the first pads 131 and the first terminals 311 may be prevented.

According to an exemplary embodiment of the present invention, a display apparatus may have a reduced manufacturing cost. In addition, a manufacturing yield of display devices may be increased. Further, the manufacturing process may be simplified.

According to an exemplary embodiment of the present invention, the bezel area of the display apparatus 1000 may be reduced.

While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. A display apparatus, comprising:
   a display panel configured to display an image and comprising a pad part, the pad part comprising a plurality of first pads disposed at a first edge thereof, wherein a first pad of the plurality of first pads has a concave shape; and
   a printed circuit board having an insertion hole that surrounds at least a portion of the pad part,
   wherein the printed circuit board comprises a plurality of first terminals disposed on an inner surface of the insertion hole to contact the plurality of first pads, wherein a first terminal of the plurality of first terminals, which contacts the concave-shaped first pad, has a convex shape in a cross view,
   wherein at least one of a first surface of the display panel and a second surface of the display panel, the second surface is opposite to the first surface, makes contact with the inner surfaces of the insertion hole.

2. The display apparatus of claim 1, wherein
   the display panel has a first side extending in a first direction and a second side, longer than the first side, extending in a second direction crossing the first direction, and
   the printed circuit board surrounds a portion of at least one of the first side or the second side of the display panel.

3. The display apparatus of claim 2, wherein the printed circuit board further comprises:
   an upper end extending in the first direction;
   a bent portion bent from the upper end; and
   a lower end connected to the upper end by the bent portion and facing the upper end.

4. The display apparatus of claim 3,
   wherein the bent portion extends in a third direction to connect a first side of the upper end to a first side of the lower end,
   wherein the third direction crosses a plane formed by the first and second directions.

5. The display apparatus of claim 3,
   wherein the bent portion comprises a first bent portion and a second bent portion, and,
   wherein the first bent portion connects a first side of the upper end to a first side of the lower end, and the second bent portion connects a second side of the upper end, disposed opposite to the first side of the upper end along the first direction, to a second side of the lower end.

6. The display apparatus of claim 5, wherein the lower end comprises:
   a first sub lower end connected to the first side of the upper end; and
   a second sub lower end connected to the second side of the upper end.

7. The display apparatus of claim 3, further comprising a plurality of pad parts,
the plurality of pad parts comprising the first pad part and a second pad part,
wherein the first pad part is disposed on a first surface of the display panel and the second pad part is disposed on a second surface of the display panel,
wherein the first pads comprise;
a plurality of first sub pads disposed on the pad part of the pad pads, which is disposed on the front surface of the display panel; and
a plurality of second sub pads disposed on the pad part of the pad parts, which is disposed on the rear surface of the display panel,
wherein the first terminals comprise:
a plurality of first sub terminals disposed on an inner surface of the upper end; and
a plurality of second sub terminals disposed on an inner surface of the lower end,
wherein the first sub pads make contact with the first sub terminals,
and the second sub pads make contact with the second sub terminals.

8. The display apparatus of claim 3, wherein the display panel further comprises
at least one driving chip disposed on the first surface of the display panel, and
the at least one driving chip is spaced apart from the printed circuit board and is disposed on the pad part.

9. The display apparatus of claim 3, wherein the display panel further comprises at least one driving chip, and
the at least one driving chip is disposed between the second surface of the display panel and the lower end of the printed circuit board.

10. The display apparatus of claim 3, wherein the plurality of first pads and the plurality of first terminals are arranged in the first direction.

11. The display apparatus of claim 10, wherein the plurality of first pads is arranged in a matrix.

12. The display apparatus of claim 3, wherein
the pad part further comprises at least one guide pad,
the printed circuit board further comprises at least one guide terminal, and
the at least one guide pad contacts the at least one guide terminal.

13. The display apparatus of claim 12, further comprising a plurality of guide pads and a plurality of guide terminals,
at least one of the plurality of first pads is disposed between a pair of adjacent guide pads of the plurality of guide pads, and
at least one of the plurality of first terminals is disposed between a pair of adjacent guide terminals of the plurality of guide terminals.

14. The display apparatus of claim 12, wherein the at least one guide pad has a concave shape in a cross sectional view, and the at least one guide terminal has a convex shape in a cross sectional view.

15. The display apparatus of claim 12, wherein the at least one guide pad has a convex shape in a cross sectional view, and the at least one guide terminal has a concave shape in a cross sectional view.

16. The display apparatus of claim 14, wherein
the at least one guide pad has an area greater than an area of at least one of the plurality of first pads, and
the at least one guide terminal has an area greater than an area of at least one of the plurality of first terminals.

17. The display apparatus of claim 14, wherein
a depth of the concave shape of the at least one guide pad is greater than a depth of the concave shape of at least one of the plurality of first pads, and
a height of the convex shape of the at least one guide terminal is greater than a height of the convex shape of at least one of the plurality of first terminals.

18. The display apparatus of claim 1,
wherein the pad part further comprises a plurality of guide pads, each of which has a concave shape in a cross sectional view,
wherein a first pad of the plurality of first pads is disposed between first and second guide pads of the plurality of guide pads,
wherein the printed circuit board further comprises a plurality of guide terminals, each of which has a convex shape in a cross sectional view,
wherein a first terminal of the plurality of first terminals is disposed between first and second guide terminals of the plurality of guide terminals, and
wherein at least one of the plurality of first pads is flat and at least one of the plurality of second terminals is flat.

19. A display apparatus, comprising:
a display panel configured to display an image and comprising a first pad part on a first surface thereof, the first pad part comprising a plurality of first pads; and
a printed circuit board having a first surface, a second surface, a third surface connecting the first and second surfaces to each other,
wherein a plane on which the first surface is disposed is parallel to or forms an acute angle with respect to a plane on which the second surface is disposed,
wherein the first surface of the display panel is disposed between the first and second surfaces of the printed circuit board such that a plurality of first terminals, disposed on the first surface of the printed circuit board, are connected to the plurality of first pads,
wherein a first terminal of the plurality of first terminals has a concave shape in a cross-sectional view, a first pad of the plurality of first pads has a convex shape in a cross-sectional view, and the convex shape of the first pad makes contact with the concave shape of the first terminal, and
wherein at least one of the first surface, the second surface and the third surface of the printed circuit board makes a direct contact with the display panel.

* * * * *